United States Patent
Haba et al.

(10) Patent No.: US 10,991,676 B2
(45) Date of Patent: Apr. 27, 2021

(54) SYSTEMS AND METHODS FOR FLASH STACKING

(71) Applicant: Invensas Corporation, San Jose, CA (US)

(72) Inventors: Belgacem Haba, Saratoga, CA (US); Ilyas Mohammed, Santa Clara, CA (US); Javier A. Delacruz, San Jose, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 16/814,175

(22) Filed: Mar. 10, 2020

(65) Prior Publication Data

US 2020/0212013 A1    Jul. 2, 2020

Related U.S. Application Data

(63) Continuation of application No. 16/368,219, filed on Mar. 28, 2019, now Pat. No. 10,593,651, which is a
(Continued)

(51) Int. Cl.
*H01L 21/78* (2006.01)
*H01L 25/065* (2006.01)
(Continued)

(52) U.S. Cl.
CPC .......... *H01L 25/0657* (2013.01); *H01L 21/78* (2013.01); *H01L 24/24* (2013.01); *H01L 24/25* (2013.01); *H01L 24/27* (2013.01); *H01L 24/33* (2013.01); *H01L 24/82* (2013.01); *H01L 25/50* (2013.01); *H01L 24/13* (2013.01); *H01L 24/32* (2013.01); *H01L 24/73* (2013.01); *H01L 24/83* (2013.01); *H01L 24/94* (2013.01); *H01L 24/97* (2013.01); *H01L 2224/244* (2013.01); *H01L 2224/245* (2013.01); *H01L 2224/24105* (2013.01); *H01L 2224/24145* (2013.01); *H01L 2224/24146* (2013.01);
(Continued)

(58) Field of Classification Search
CPC ........ H01L 21/78; H01L 24/24; H01L 24/82; H01L 24/27; H01L 24/25; H01L 24/33; H01L 25/50; H01L 25/0657
USPC ........................................................ 438/462
See application file for complete search history.

(56) References Cited

U.S. PATENT DOCUMENTS 5,266,833 A    11/1993  Capps
6,762,075 B2    7/2004  Kim et al.
(Continued)

FOREIGN PATENT DOCUMENTS

KR    10-2008-0046020    5/2008

OTHER PUBLICATIONS

International Search Report and Written Opinion for PCT Application No. PCT/US2019/030423, dated Aug. 22, 2019, 13 pages.
(Continued)

*Primary Examiner* — Luan C Thai

(57) ABSTRACT

A three-dimensional stacking technique performed in a wafer-to-wafer fashion reducing the machine movement in production. The wafers are processed with metallic traces and stacked before dicing into separate die stacks. The traces of each layer of the stacks are interconnected via electroless plating.

13 Claims, 7 Drawing Sheets

Related U.S. Application Data continuation of application No. 15/993,271, filed on May 30, 2018, now Pat. No. 10,290,612.

(51) Int. Cl.
  *H01L 23/00* (2006.01)
  *H01L 25/00* (2006.01)

(52) U.S. Cl.
  CPC ............. *H01L 2224/2518* (2013.01); *H01L 2224/25175* (2013.01); *H01L 2224/27464* (2013.01); *H01L 2224/2919* (2013.01); *H01L 2224/29139* (2013.01); *H01L 2224/29144* (2013.01); *H01L 2224/29147* (2013.01); *H01L 2224/29155* (2013.01); *H01L 2224/32145* (2013.01); *H01L 2224/33183* (2013.01); *H01L 2224/33505* (2013.01); *H01L 2224/73153* (2013.01); *H01L 2224/73253* (2013.01); *H01L 2224/73259* (2013.01); *H01L 2224/73267* (2013.01); *H01L 2224/821* (2013.01); *H01L 2224/82047* (2013.01); *H01L 2224/83906* (2013.01); *H01L 2224/94* (2013.01); *H01L 2224/97* (2013.01); *H01L 2225/06551* (2013.01); *H01L 2924/1451* (2013.01)

(56) References Cited

U.S. PATENT DOCUMENTS

| | | |
|---|---|---|
| 7,282,431 B2 | 10/2007 | Kang et al. |
| 7,285,850 B2 | 10/2007 | Poo et al. |
| 7,829,998 B2 * | 11/2010 | Do .................... H01L 25/03 257/698 |
| 9,159,705 B2 | 10/2015 | Jang et al. |
| 10,304,816 B2 | 5/2019 | Kumar et al. |
| 2009/0134527 A1 | 5/2009 | Chang |
| 2012/0126350 A1 | 5/2012 | Horning |

OTHER PUBLICATIONS

Lapedus, Mark, "NAND Market Hits Speed Bump: Transition from Planar to 3D NAND is Harder and More Time-Consuding Than Expected," https://semiengineering.com/author/mark-lapedus/, date unknown, 12 pages.

Patti, Robert, "Wafer Level Stacking: The Brave New World of Very Advanced Packaging," Tachyon Semiconductor, http://www.ewh.ieee.org/soc/cpmt/tc12/fdip01/patti.pdf, date unknown, 46 pages.

\* cited by examiner

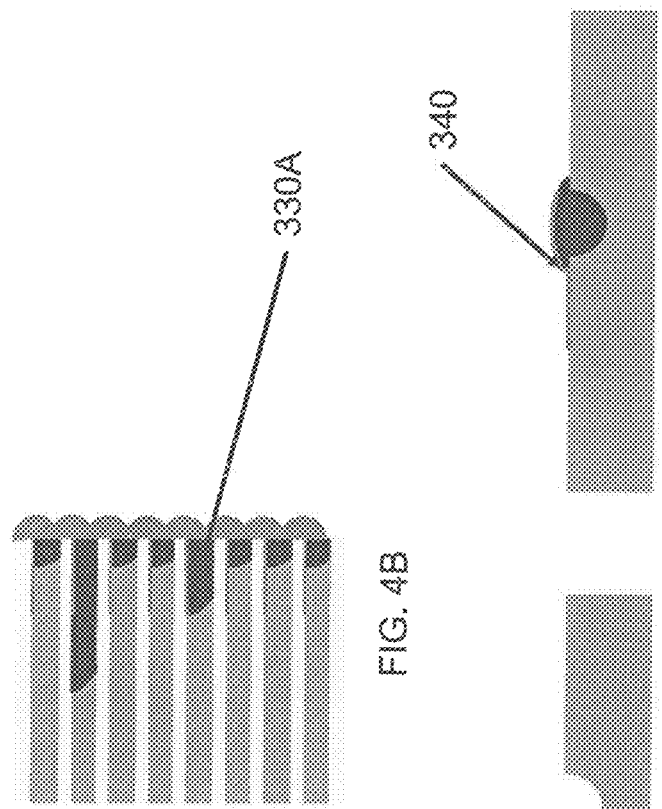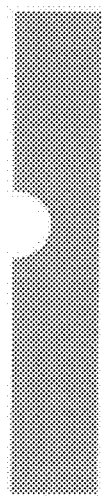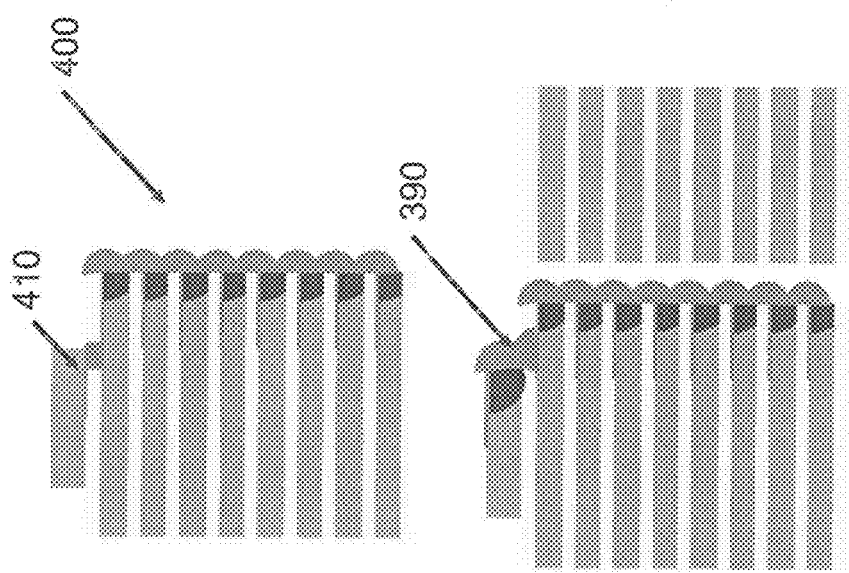
FIG. 4B
FIG. 4C
FIG. 4A

SYSTEMS AND METHODS FOR FLASH STACKING

CROSS-REFERENCE TO RELATED APPLICATION(S)

This application is a continuation of and claims priority to U.S. patent application Ser. No. 16/368,219, filed on Mar. 28, 2019, which is a continuation of U.S. patent application Ser. No. 15/993,271, filed on May 30, 2018, now U.S. Pat. No. 10,290,612, issued May 14, 2019, each of which is incorporated by reference herein in its entirety for all purposes.

FIELD OF THE INVENTION

The following description relates to the stacking of silicon wafers used in the manufacture of integrated circuits. More specifically, the following description relates to stacked multi-layer wafers and the process of connecting the layers for an integrated circuit, printed circuit board, or memory components.

BACKGROUND

Microelectronics typically involve the use of thin semiconductor materials such as silicon wafers that may be formed into individual units. Such elements are often used in integrated circuits (ICs) that may be subsequently installed onto printed circuit boards (PCBs). The field of Microelectronics has rapidly expanded over the last few decades with a demand for greater storage or memory capacity and decreased size. Additionally, cost reduction is a continual concern that greatly influences the development of new microelectronic technologies and procedures.

The demand for consumer products and applications for higher performance, higher capacity and lower cost has driven the demand for smaller, more capable microelectronic components. Such increased demand for smaller sizes has led to the development of 3D stacking. 3D-Stacking typically involves the stacking of microelectronic components in a vertical fashion and applying vertical interconnections between the layers. Traditionally vertical interconnection methods have included through-silicon vias (TSVs), wire bonding, and flip chip methods that have enabled manufactures to produce ICs that have greater capacity and a smaller footprint.

With the increase in demand for smaller size and greater capacity the balance of performance, capacity, and cost is the challenge in the development of microelectronic components. The current methods used for stacking and bonding have increased in cost due to the increase in time of manufacture and cost of materials used.

SUMMARY OF THE INVENTION

Systems and methods in accordance with various embodiments provide a flash stacking at a wafer level and subsequent interconnecting of wafers in a three dimensional format. In a number of embodiments, the three dimensional stack includes a plurality of wafers with grooves configured to be within the dicing lanes and filled with a dielectric material and configured to be interconnected between a plurality of contact pads by way of electroless plating.

Many embodiments are directed to a chip level stack with a plurality of thinned chips each of the plurality of thinned chips having a first surface and a second surface opposite the first surface and a plurality of side surfaces, wherein at least one side surface is covered by a dielectric material that extends from the first surface to the second surface; a plurality of bonding layers disposed between each of the plurality of thinned chips; a plurality of conductive pads disposed on a first surface of each of the plurality of thinned chips; a plurality of conductive traces on the first surface that are disposed by printing, direct imaging, and/or stenciling, wherein each of the plurality of conductive traces is in electrical contact with at least one of the plurality of conductive pads disposed on the first surface and configured to extend over the dielectric material of at least one side surface covered by a dielectric material, and wherein each of the plurality of conductive traces has at least one corresponding trace on each of the plurality of thinned chips; and electroless plated connections at least partially disposed over the dielectric material and configured to connect the plurality of printed conductive traces between each of the plurality of thinned chips with the corresponding trace.

In other embodiments, the dielectric material is configured to be equal in size and shape.

In still other embodiments, the dielectric material is configured to be a variety of shapes and sizes between the plurality of chips.

In yet other embodiments, the dielectric material has a CTE similar to that of the plurality of thinned chips.

In other embodiments, the distance between the printed conductive traces on each of the plurality of thinned wafers or chips, is greater than the combined thickness of the thinned wafer or chip and the bonding or adhesive layer.

In yet other embodiments, an additional element is bonded to a top surface of the stack and configured to connect to the traces of the plurality of thinned chips with an additional electroless plated connection.

In still yet other embodiments, a top surface of the stack is configured to adapt to a chip scaled package format.

In other embodiments, the chip scaled format is a flip chip format.

In still other embodiments, the metal used for the electroless plated connection is selected from a group consisting of nickel, copper, silver, and gold.

Numerous embodiments include a method for producing a microelectronic stack where a plurality of wafers having a first face and a second face. The plurality of wafers each have a predetermined pattern of pathways and a predetermined number of dicing lanes disposed thereupon. A portion of the plurality of wafers is removed along the dicing lanes such that a groove is formed within the dicing lanes of the body of the wafer from the first face but extending only partially through the body such that the groove does not to extend to the second face. A dielectric material is disposed within the groove. A plurality of metallic traces are disposed over the dielectric material by printing, direct imagining, and/or stenciling. The traces are interconnected with at least one of the pathways. Material is removed from the second face of the plurality of wafers such that the removal of material reduces the thickness of the plurality of wafers to expose the groove formed therein. An adhesive layer is applied to a face of the wafer. A plurality of wafers are stacked such that the dicing lanes and grooves formed therein are aligned according to the predetermined pattern thereby producing a stack of wafers. the stack of wafers is then diced along the predetermined dicing lanes such that the dicing exposes a vertical edge of a stack. The exposed vertical edge includes the dielectric material and the metallic trace. The metallic traces are then interconnected along the vertical edge through electroless plating.

In other embodiments, the cut stacks of wafers are separated by tape stretching.

In still other embodiments, the dielectric material comprises a mixture of epoxy and silica.

In yet still other embodiments, the stack of wafers is further bonded to an integrated circuit via a method selected from a group consisting of solder bonding and electroless plating.

In even other embodiments a partial portion of the dielectric material may be removed thereby increasing or enlarging the contact area between the electroless plating and the conductive traces.

In yet other embodiments a plurality of dielectric layers may be disposed in the groove and wherein the plurality of dielectric layers may be organic, inorganic, or a combination of both. In some embodiments the dielectric material may be selected from a group consisting of silicon oxide, silicon nitride, aluminum oxide, polyimide, epoxy, elastomer and electrophoretically deposited polymer.

In some embodiments at least one corresponding trace may not be connected to a conductive pad.

Additional embodiments and features are set forth in part in the description that follows, and in part will become apparent to those skilled in the art upon examination of the specification or may be learned by the practice of the disclosed subject matter. A further understanding of the nature and advantages of the present disclosure may be realized by reference to the remaining portions of the specification and the drawings, which form a part of this disclosure.

BRIEF DESCRIPTION OF THE DRAWINGS

The description will be more fully understood with reference to the following figures, which are presented as various embodiments of the disclosure and should not be construed as a complete recitation of the scope of the disclosure, wherein:

FIG. 4A illustrates a stack of wafers with an additional element disposed on the top surface of the stack according to various embodiments.

FIG. 4B illustrates a flash wafer stack according to various embodiments of the invention.

FIG. 4C illustrates various tracing applications in accordance with various embodiments of the invention

DETAILED DESCRIPTION

Figure 1:
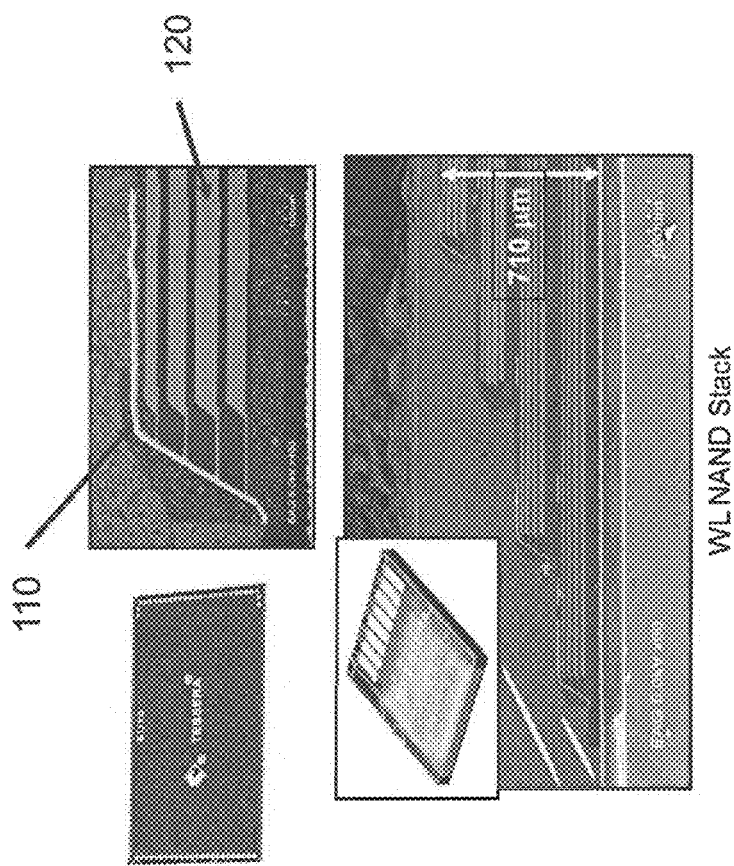
FIG. 1 illustrates a sample of a Wafer Level (WL) NAND Stacking method known in the field.

The present disclosure may be understood by reference to the following detailed description, taken in conjunction with the drawings as described below. It is noted that, for purposes of illustrative clarity, certain elements in various drawings may not be drawn to scale.

Multi-layer microelectronic structures, and systems and methods of stacking and producing multi-layer microelectronic structures to reduce manufacturing time and cost are disclosed. Embodiments disclosed herein relate to obtaining a wafer (e.g. wafer containing flash dies) made of suitable material designed to be used within microelectronic structures. The wafer has grooves, corresponding to dicing lanes, cut into the surface and subsequently filled with a non-conductive material. Many embodiments include the addition of conductive pathways prior to thinning and bonding multiple wafers into a stack. Once stacked, the wafers may then be cut or diced along the dicing lanes and separated into individual dies to be used in a variety of microelectronic structures.

Traditional methods of producing microelectronics and/or ICs typically start with the creation or placement of metallic traces or electronically conductive pathways on the surface of a silicon wafer. The pathways are typically associated with individual dies that are eventually cut from the silicon wafer. Traditional methods of placing the traces involve a variety of techniques. The most popular method of disposing traces has typically been through electroplating. Other methods have included growing the trace pathways as well as placing a conductive layer over the wafer and later using chemical or light to create the desired pathways of the component.

In such conventional methods, the silicon wafer is typically cut into individual dies that can be stacked to create the three dimensional (3-D) stacking within an IC once traces have been placed. In most cases an adhesive layer or bonding layer is applied to the dies to begin stacking. The method of stacking typically follows a pick-and-place method in which a machine will select an individual diced die and stack it. The machine moves back and forth selecting the next die and stacking it on the previous one. This stacking usually takes place in groups in which the machine will create a group of stacked dies then stack the groups according to the desired number of layers and capacity. Additionally, each die is typically tested prior to being stacked to ensure viability as a single bad die can cause an entire stack to not function. Once the dies have been stacked the individual layers need to be interconnected to create the final component.

Conventional methods of interconnection typically use a method called wire bonding. Wire bonding is a method by which a gold wire is physically bonded between each layer thus interconnecting the various trace pathways for each level of the stacked dies. This is similar to the WL NAND stack shown in FIG. 1. There the wire bond or lead structure 110 connects each of the stacked dies 120. Other methods that have been introduced in the industry include the use of TSVs.

TSVs typically involve electroplating the vias with a conductive material. The vias run through the wafer substrate between the various layers of dies and when electroplated create an electrical connection.

Such traditional methods of stacking and interconnecting have proven to be costlier than desired. As mentioned, for example, the die-to-die stacking using a pick-and-place method requires more machine movements which can lead to inefficient processing and increasing overall manufacturing costs. Furthermore, these methods often include a stacking method with a cross-section that resembles a staircase profile as illustrated in FIG. 1. The staircase profile 130 will ultimately increase the x-y dimensional characteristics of the stack which in many ways goes against the desired outcome of decreasing the size of the microelectronics through 3-D stacking. Such stacking methods are adding to the overall cost and taking away from the desired outcome of the end product.

Additionally, interconnection methods by way of wire bonding and even TSVs are adding to the overall cost of manufacture. Because of its reliability in transmitting low voltage signals and its resistance to corrosion, gold has typically been the material of choice for most Interconnections including wire bonding. The fluctuation of gold prices has led to increased cost of these various methods of interconnecting dies.

Other techniques for dicing and interconnecting have been used that have proven to not be as cost effective and thus have not become industry standard methods of production. For example, a typical Shell-case method of manufacture would include the use of a "V" shaped dicing lane that cuts the wafers. The "V" shaped dicing lane exposes the edges of the wafers for bonding. The interconnection is subsequently performed by electroplating or lithograph printing of conductive layers at the edges. Accordingly, new methods for dispersing traces as well as stacking and interconnecting layers are essential to the future development and production of cost effective components.

Figure 2:
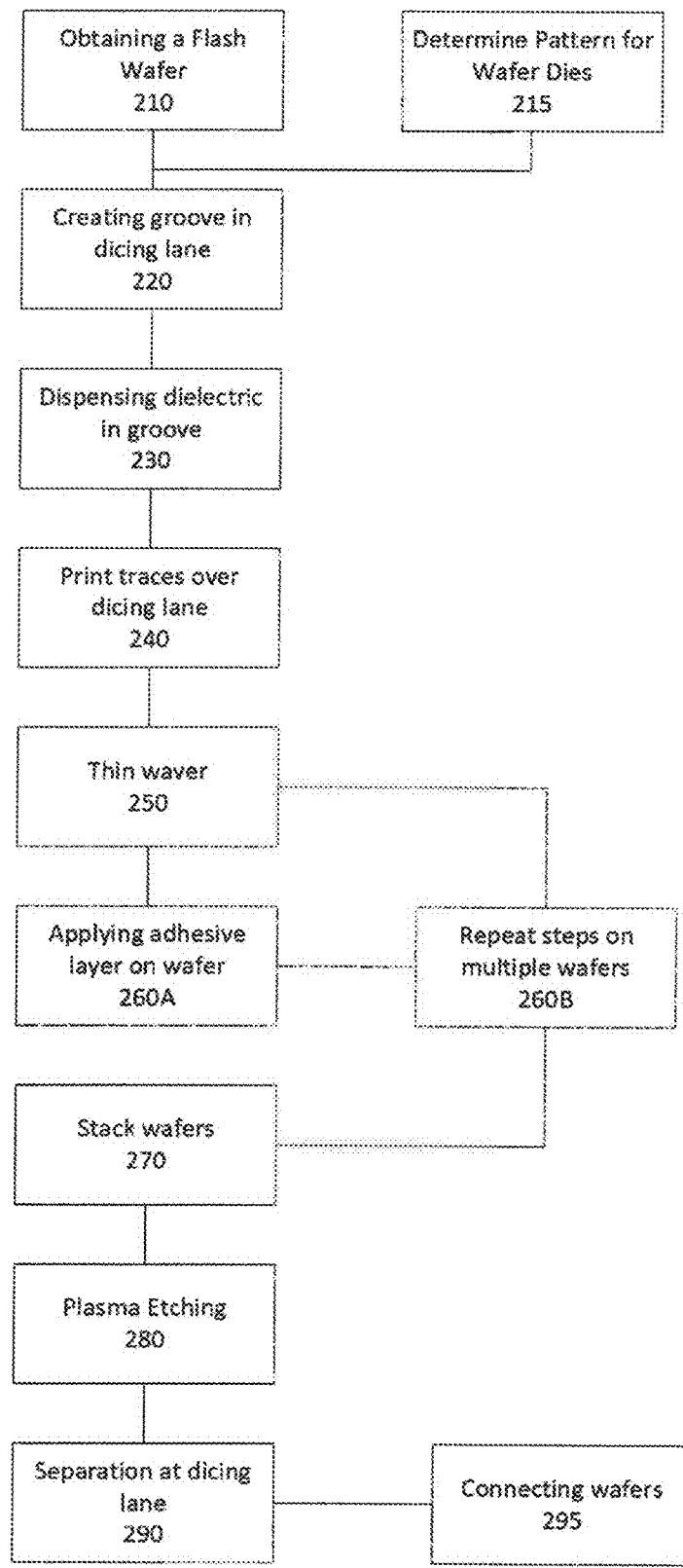
FIG. 2 illustrates an exemplary embodiment of a method of stacking in accordance with embodiments of the invention.

In accordance with many embodiments multi-layer microelectronic structures and methods of stacking dies at the wafer level are illustrated in FIGS. 2-5. FIG. 2, illustrates, in a flow diagram, an exemplary embodiment of the process disclosed herein whereas FIGS. 3-5 pictorially illustrate a stacking and interconnecting method in accordance with many embodiments of the invention.

The schematic illustration of FIG. 2 summarizes an exemplary process in which microelectronic components and stacks are produced at the wafer level. Each block of FIG. 2 represents a step in the process of producing a 3-D flash wafer stack in accordance with many embodiments. The corresponding steps are further illustrated in FIG. 3 by cross-sectional views of the various components during the methods steps of FIG. 2.

Figure 3:
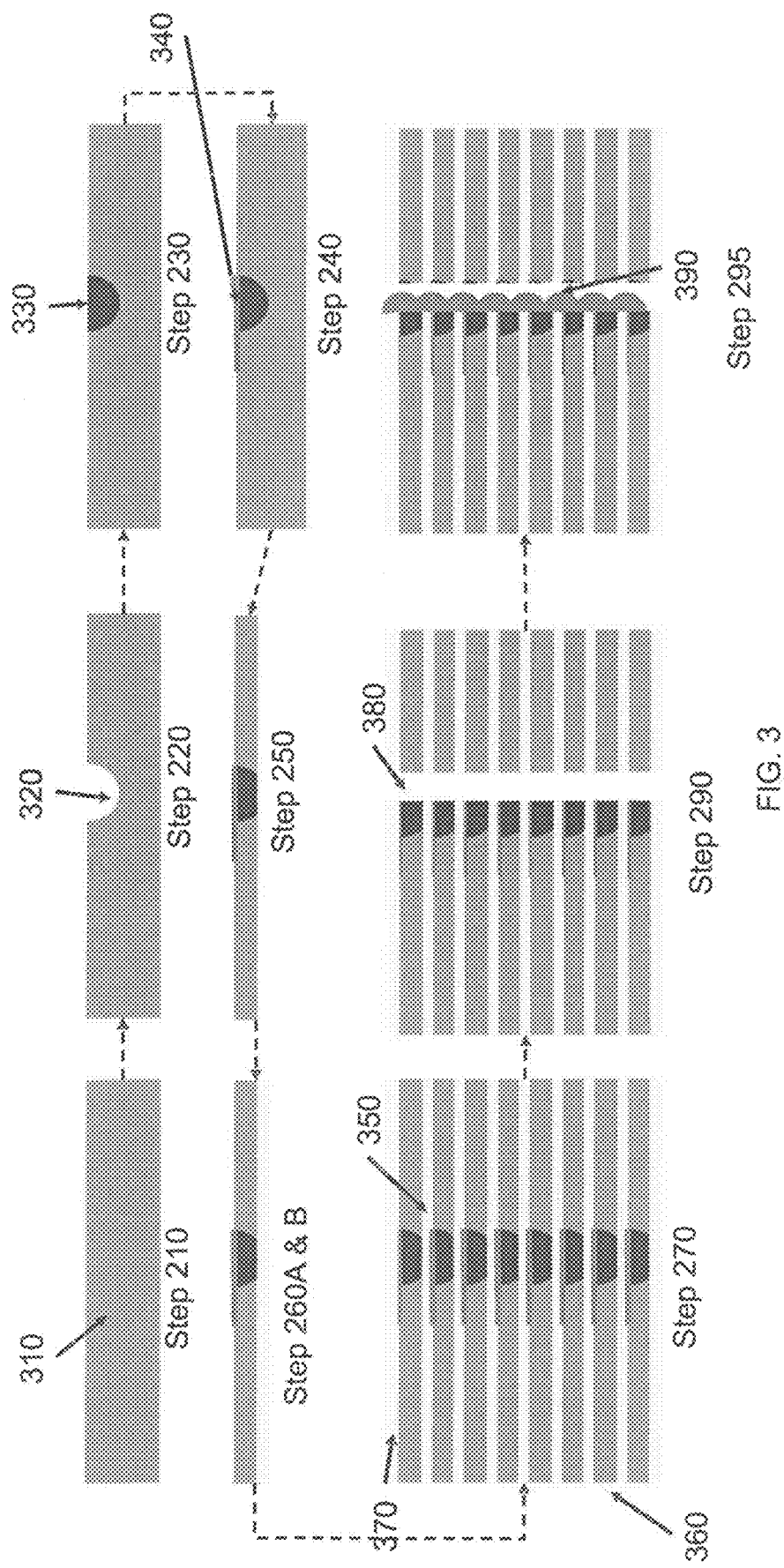
FIG. 3 illustrates a cross sectional view of a stacking method in accordance with embodiments of the invention.

Turning now to FIG. 3 in relation to the flow represented in FIG. 2, many embodiments are illustrated. In step 210 of such embodiments, a whole semiconductor wafer 310 is selected according to the desired properties of the final product. According to some embodiments a predetermined pattern is established in step 215 for the placement of conductive paths and dicing lanes.

Once the predetermined paths have been established, a groove 320 may be cut in the surface of the wafer along the dicing lanes in step 220. The dimensions of the groove are carefully determined according to the desired outcome of the wafer and dies. The groove, according to many embodiments does not extend through the entire thickness of the wafer but rather stops at a predetermined distance such that the groove may be filled. In step 230 the groove, placed along the dicing lanes, may be filled with a non-conductive dielectric material 330.

The next step 240, according to many embodiments, involves the disposing of the conductive pathways 340 on the surface of the wafer. The conductive pathways or traces 340 are disposed in such a manner that they extend over the dielectric material 330 such that during a latter portion of the fabrication process the edge of the traces 340 are exposed for bonding.

Step 250 continues the process according to many embodiments by which the wafers may be thinned such that material is removed from the bottom portion of the wafer. Material is removed to the extent that the previously placed groove filled with dielectric material is exposed. Once the wafer has been thinned, in many embodiments, step 260A is followed where the wafer(s) may have an adhesive layer 350 applied such that the thinned wafers may be stacked and bonded. The location of the adhesive layer whether on top or bottom of the wafer is not essential only that it is placed prior to stacking the wafers.

In many embodiments, the aforementioned process can be repeated multiple times, represented by step 260B to prepare each wafer for stacking. Step 270 involves the stacking of the prepared wafers 360 and preparing them for dicing. Many embodiments may include the application of a tape layer 370 to aid in later processing.

The stacking at a wafer level as disclosed in the embodiments herein, helps to reduce production costs because the entire wafer, having a number of dies exposed thereon, is stacked. The machine(s) processing the wafer will not have as many movements as it would in a pick-and-place method previously described. For example, a grouping of 16 wafers could be stacked ultimately producing a number of stacked dies and only requiring the machine to move those 16 times for wafer placement versus the 16 movements multiplied by the total number of dies. The wafer level stacking is a significant improvement in efficiency for microelectronics manufacturing.

In step 290 according to many embodiments, the wafers are diced along the dicing lanes such that a space 380 is created between the diced portions of the wafers. The separation, according to some embodiments may include tape stretching to increase the separation after dicing. Once diced, the vertically stacked layers leave an exposed edge exposing the dielectric material as well as the traces for each wafer layer such that each layer can be interconnected.

The interconnection step 295, according the many embodiments involves the process of bonding each of the wafer layers through electroless plating. Electroless plating does not involve the use of wire bonding between layers or plating of TSVs. It is an auto-catalytic reaction wherein a chemical bath is used to place a metal onto some substrate or base. The chemical bath typically involves a reducing agent that acts to bind the metal ions to the substrate. The use of electroless plating reduces the amount of metal required to create the interconnections. Additionally, electroless plating prevents corrosion and wear. Thus, the use of electroless plating to create the interconnection bonds is an improvement on past methods because it uses less material and reduces the overall cost of production.

Embodiments of Groove and Dielectric

In accordance with many embodiments the groove 320 is consistent between the multiple layers of the stacked microelectronic as illustrated in FIG. 3 in steps 270 to 295; wherein each layer illustrates a similar amount of dielectric material 330 disposed in each corresponding groove 320. In other embodiments the groove 330A may vary in size as illustrated in FIG. 4B. It may be desirable, according to some embodiments to vary the groove width depending on the desired characteristics of the individual dies that will be produced on each wafer. In other instances, a misalignment may be accommodated based on the width of the grove relative to the dicing path. However, as illustrated in FIGS. 3 and 4B the vertical edge of exposed dielectric and tracing material does not change in the Y direction throughout the stacking and subsequent interconnection through electroless plating. In previous methods mentioned the Y dimension would gradually increase as represented by the staircase cross-section in FIG. 1. The embodiments disclosed herein illustrate no variation in the Y dimension of the stacking therefor reducing the size of the overall stack for a preferred method of stacking even with varying sizes of dies within the stack.

In accordance with many embodiments the dielectric material disposed in the groove should be sufficient to cover all surfaces of the groove in the wafer material. FIG. 4C illustrates various embodiments in which the dielectric material 330 is disposed in such a manner that ensures all surfaces of the groove are covered by the dielectric material 330.

The dielectric material, in accordance with many exemplary embodiments should be configured to have a low Coefficient of Thermal Expansion (CTE). The CTE of a material is the rate at which it expands when heat is applied. Traditionally, materials used in PCBs have low CTEs as compared to the CTE of copper for example. As the wafer undergoes various processing steps typical in the industry it may be exposed to a variety of heating and cooling cycles. Therefore, the lower the dielectric CTE or closer it is to the CTE of the wafer 310 the less likely it will break or lose its bond through processing and thus preserve the traces that will later be disposed thereupon.

For example, typical silicon wafers will have a CTE of 3-4 ppm/° C. and dielectrics may have higher CTE's depending on their composition. In accordance with many embodiments the dielectric 330 may be composed of a bonding agent and particles of silica to help reduce the CTE of the dielectric 330 to be closer to that of the wafer material.

Embodiments of the Traces

As illustrated in FIGS. 3-4C, according to many embodiments, traces may be dispensed over the dielectric material. In accordance with many embodiments the traces are dispersed over the dielectric such that in later processing or die cutting the edges of the traces will be exposed for interconnections to be placed between stacked wafers.

Traditional methods of dispersing traces 340 have created a cost concern for the industry leading to the need for improved methods of creating traces. Many embodiments incorporate state of the art screen printing methods of placing traces on the wafer. As illustrated in FIG. 4C, screen printing methods or stenciling methods of disposing traces onto the wafers over the dielectric material may be used. As illustrated in FIG. 4C, the screen printing and stenciling methods in many embodiments may produce traces that are longer and wider in the X and Y dimensions respectively than they are in the Z direction.

According to many embodiments the screen printing method is capable of producing dimensionally controlled traces that will provide excellent conductive properties and work well with the additional steps of stacking described herein. Printing the traces is a preferred method according to many embodiments. A key advantage of printing the traces over traditional lithography and plating methods is the material cost savings.

Embodiments of the Stacking and Electroless Plating

Figure 5B:
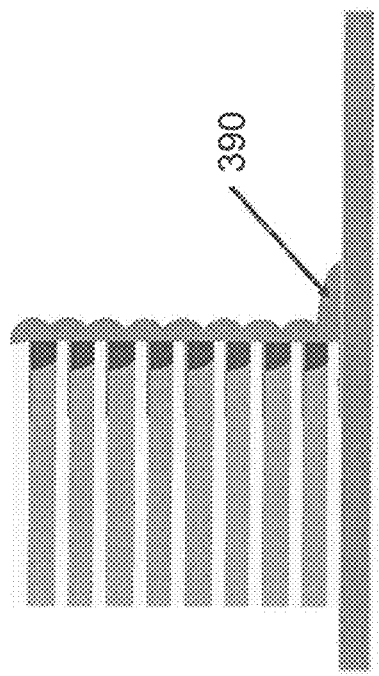
FIG. 5B illustrates the binding of a stack of wafers to an IC in accordance with many embodiments
Figure 5A:
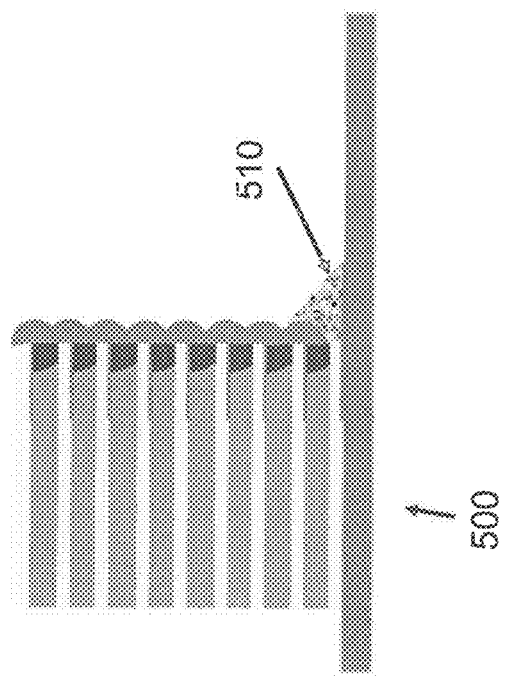
FIG. 5A illustrates the binding of a stack of wafers to an IC in accordance with some embodiments of the invention.

As illustrated in FIGS. 4A and 5A and B the stacking of the wafers may be illustrated by various embodiments. FIG. 4A illustrates that in many embodiments additional elements 410 may be added to the stack such that only the Z dimension of the overall stack is increased. Such additional elements 410 may be processed in a similar fashion as the flash wafers in the stack in that a groove filled with dielectric may be cut and a tracing dispose thereupon. Subsequently, many embodiments may use further electroless plating to electrically bond the additional element 410 to the reminder of the stack.

FIGS. 5A and B illustrated various embodiments in which the stack may be bonded to an IC or other component. FIG. 5A illustrates a method of bonding the stack to an IC or other component by means of a soldering technique that maybe considered common place in the industry. In contrast, FIG. 5B illustrates the cost savings bonding method of electroless plating the stack to the IC.

According to many embodiments the electroless plating will consist of a chemical bath for the stack or entire component depending on the level of production and desired bonding process. In many embodiments the chemical bath may include the metal ions from nickel, silver, copper, or gold.

Figure 6A:
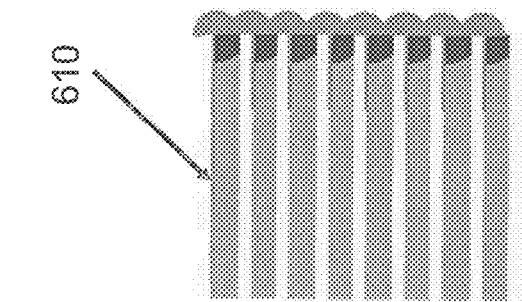
FIG. 6A illustrates a stack of wafers with exposed conductor pads in accordance with various embodiments of the invention.
Figure 6B:
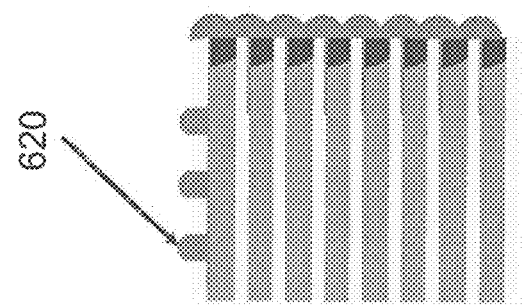
FIG. 6B illustrates a flash wafer stack in accordance with various embodiments of the invention.
Figure 6C:
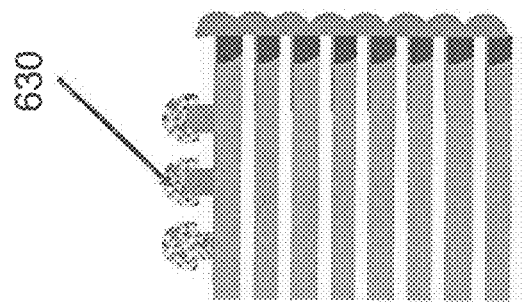
FIG. 6C illustrates a flash wafer stack in accordance with various embodiments of the invention.

As illustrated in FIGS. 6A to 6C according to some embodiments, the wafer stack may be configured in a Chip Scale Package (CSP) format. A CSP format is a format in which the stack occurs such that the end level die is configured in a direct surface mountable package to be mounted directly to a PCB. In such packages the final surface of the stack may have exposed conductor pads 610 that may be configured with conductive bumps 620 or solder bumps 630. The final die package 640 may be mounted directly to the PCB or IC by aligning the bumps with corresponding pads on the PCB or IC. Such processes are also known as Flip Chip in which the completed stack is flipped over and connected to the PCB or IC.

Figure 7B:
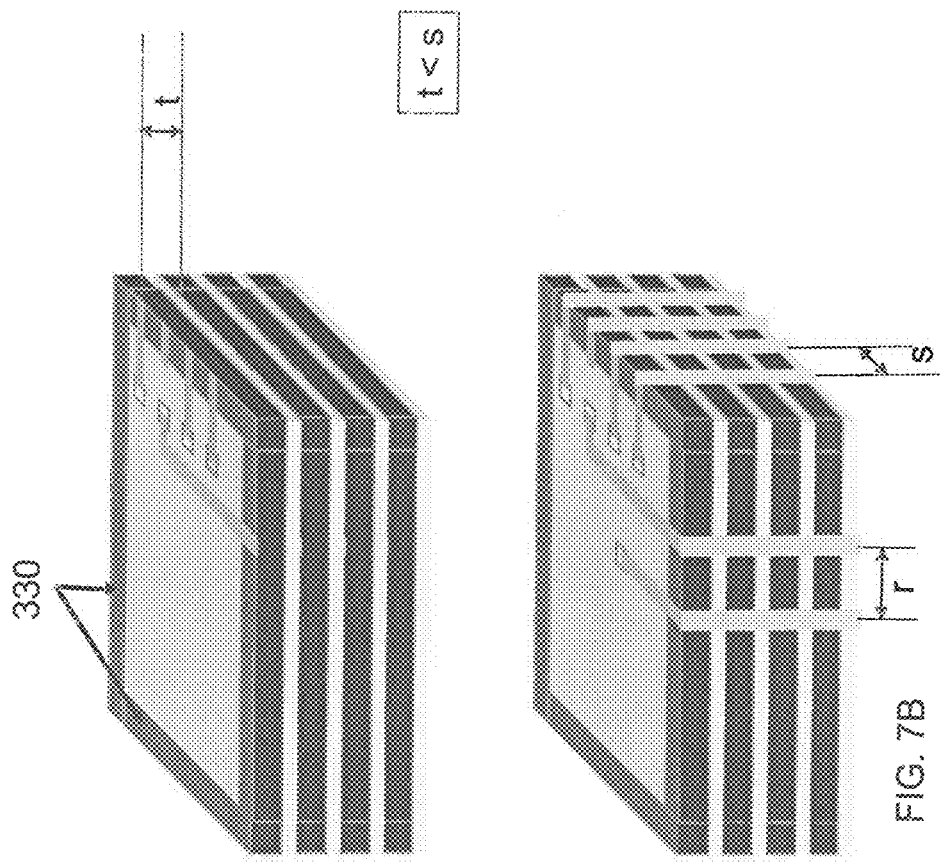
FIG. 7B illustrates a flash wafer stack in accordance with many embodiments.
Figure 7A:
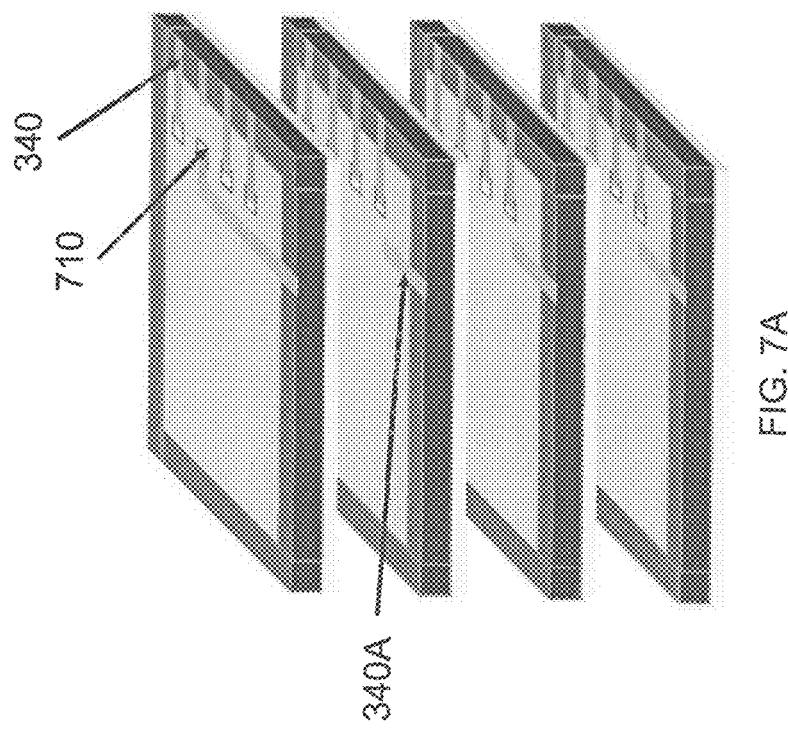
FIG. 7A illustrates a flash wafer stack with various tracing patterns according to various embodiments.

In accordance with many embodiments, the traces may be dispersed in various patterns on each of the individual dies. For example, FIG. 7A illustrates different trace patterns in accordance with many embodiments of the invention. The individual dies that will be cut from the wafers, according to many embodiments, will have conductive pads 710 disposed thereon prior to cutting. In many embodiments the conductive pads 710 require traces 340 connected thereto to and directed to the dielectric material 330 or the dicing lanes.

FIG. 7A further illustrates that in many embodiments conductive pads 710 may require a partial trace path 340A in conjunction with a regular trace path 340. When the wafers are stacked according to the embodiments described herein, each conductive pad 710 needs to be connected to each layer of the flash wafer stack. Accordingly, the conductive pads 710 may require partial traces 340A corresponding location of the conductor pads on each of the stacked wafers. For example, the top wafer in FIG. 7A illustrates a different trace pattern than the lower wafers. The conductive pad 710 that has a different trace pattern requires partial traces 340A to correspond to the upper level trace such that it is connected to all lower level wavers. Likewise, the lower wafers with pads in the corresponding positon that have different trace patterns require a partial trace on the top wafer to connect them to the top wafer. Such connections ensure the proper pitch is maintained between traces in the stack.

Pitch of the wafer refers to the spacing between the traces. In FIG. 7B the Z dimensional pitch is depicted by "t" and the X and Y dimensions are depicted by "r" and "s" respectively.

The Z dimension between traces corresponds to the thickness of the individual wafers and adhesive layer combined. In order for the systems and methods described herein, many embodiments may be configured such that the pitch in the X and Y dimension is greater than the pitch in Z dimension such relation can be illustrated by the equations t<r or t<s. Maintaining the relation between "t" and "s" or "r" is essential to ensure the proper function of the stack according to many embodiments.

Doctrine of Equivalents

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

What is claimed is:

1. A method for producing a microelectronic stack comprising:
    providing a plurality of wafers having a first face and a second face forming a body thereof for production of microelectronic components, the plurality of wafers each having at least one dielectric region thereon wherein the at least one dielectric region extends from the first face to the second face;
    disposing a plurality of conductive metallic traces over the dielectric region in a manner selected from a group consisting of printing, direct imaging, and stenciling wherein each of the conductive metallic traces has at least one corresponding trace on each of the plurality of wafers;
    bonding each of the plurality of wafers thereby forming a layered stack of wafers,
    wherein the first face of one of the plurality of wafers is bonded to the second face of another one of the plurality of wafers;
    dicing the layered stack of wafers along predetermined dicing lanes such that the dicing exposes a vertical edge of a stack wherein the exposed vertical edge is formed of the dielectric region and the plurality of conductive metallic traces; and
    interconnecting the metallic traces along the vertical edge through electroless plating such that the metallic traces are electronically interconnected through each layer of the stack.

2. The method of claim 1 wherein the dielectric region for each of the plurality of wafers is consistent in size and shape.

3. The method of claim 1 wherein the dielectric region for each of the plurality of wafers is a different size and dimension.

4. The method of claim 1 wherein the metal used in the electroless plating is selected from a group consisting of nickel, copper, silver, and gold.

5. The method of claim 1 wherein an additional element is bonded to an outer surface of the layered stack of wafers.

6. The method of claim 1, wherein the distance between the conductive traces on each of the plurality of wafers in the layered stack of wafers is greater than the thickness of one of the plurality of wafers.

7. The method of claim 1 further comprising partially removing some dielectric material from the dielectric region in an area proximal to the at least one of the plurality of conductive traces.

8. The method of claim 1, wherein bonding comprises providing a bonding layer on at least one of the plurality of wafers and bonding that wafer to another of the plurality of wafers through the bonding layer.

9. The method of claim 1, wherein at least one of the plurality of metallic traces is a partial trace.

10. The method of claim 9, wherein the partial trace corresponds to another partial trace on a corresponding bonded wafer.

11. The method of claim 9, wherein the partial trace corresponds to a regular trace path, wherein the regular trace path is connected to a conductive pad.

12. The method of claim 10, wherein each of the corresponding partial traces correspond to a regular trace path that is connected to a conductive pad.

13. The method of claim 1, wherein the microelectronic stack is configured in a chip scale package format.

* * * * *